United States Patent
Sun et al.

(10) Patent No.: US 11,372,061 B2
(45) Date of Patent: Jun. 28, 2022

(54) HALL EFFECT SENSOR DEVICES AND METHODS OF FORMING HALL EFFECT SENSOR DEVICES

(71) Applicant: GLOBALFOUNDRIES Singapore Pte. Ltd., Singapore (SG)

(72) Inventors: Yongshun Sun, Singapore (SG); Eng Huat Toh, Singapore (SG); Ping Zheng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 87 days.

(21) Appl. No.: 16/817,623

(22) Filed: Mar. 13, 2020

(65) Prior Publication Data
US 2021/0286025 A1 Sep. 16, 2021

(51) Int. Cl.
| | | |
|---|---|---|
| G01R 33/07 | (2006.01) | |
| G01R 33/00 | (2006.01) | |
| H01L 43/14 | (2006.01) | |
| H01L 43/06 | (2006.01) | |
| H01L 43/04 | (2006.01) | |

(52) U.S. Cl.
CPC ......... *G01R 33/07* (2013.01); *G01R 33/0052* (2013.01); *H01L 43/04* (2013.01); *H01L 43/065* (2013.01); *H01L 43/14* (2013.01)

(58) Field of Classification Search
CPC ..... G01R 33/07; G01R 33/0052; H01L 43/14; H01L 43/065; H01L 43/04
See application file for complete search history.

(56) References Cited

U.S. PATENT DOCUMENTS 6,492,697 B1    12/2002  Plagens et al.
8,426,936 B2 *  4/2013   Minixhofer ............ H01L 43/14
                                                       257/421
(Continued)

FOREIGN PATENT DOCUMENTS

| FR | 2820211 A1 | 8/2002 |
| TW | 201029107 A | 8/2010 |
| TW | 201717227 A | 5/2017 |

OTHER PUBLICATIONS

Sander et al., "Novel Compact Two-Dimensional CMOS Vertical Hall Sensor", 2015 Transducers—2015 18th International Conference on Solid-State Sensors, Actuators and Microsystems (Transducers), 2015, pp. 1164-1167, IEEE.

(Continued)

*Primary Examiner* — Dominic E Hawkins
(74) *Attorney, Agent, or Firm* — Viering Jentschura & Partner mbB

(57) ABSTRACT

A Hall effect sensor device may be provided, including one or more sensor structures. Each sensor structure may include: a base layer having a first conductivity type; a Hall plate region having a second conductivity type opposite from the first conductivity type arranged above the base layer; a first isolating region arranged around and adjoining the Hall plate region, and contacting the base layer; a plurality of second isolating regions arranged within the Hall plate region; and a plurality of terminal regions arranged within the Hall plate region. The first and second isolating regions may include electrically insulating material, and each neighboring pair of terminal regions may be electrically isolated from each other by one of the second isolating regions.

20 Claims, 10 Drawing Sheets

(56) References Cited

U.S. PATENT DOCUMENTS

| | | |
|---|---|---|
| 9,097,753 B2 | 8/2015 | Raz et al. |
| 10,050,082 B1* | 8/2018 | Liu .......................... H01L 27/22 |
| 2010/0198550 A1 | 8/2010 | Schauer et al. |
| 2013/0342194 A1* | 12/2013 | Motz ................... G01R 33/077 |
| | | 324/251 |
| 2014/0070795 A1* | 3/2014 | Kolb .................. G01R 33/0052 |
| | | 324/202 |
| 2017/0125343 A1 | 5/2017 | Chang et al. |
| 2017/0271399 A1* | 9/2017 | Lee .......................... H01L 43/04 |
| 2018/0031644 A1* | 2/2018 | Ausserlechner ... G01R 33/0029 |
| 2019/0086484 A1 | 3/2019 | Green et al. |

OTHER PUBLICATIONS

Examination report from parallel TW patent application 110104741 dated Jan. 17, 2022, 3 pages (for reference purposes only).

* cited by examiner

HALL EFFECT SENSOR DEVICES AND METHODS OF FORMING HALL EFFECT SENSOR DEVICES

TECHNICAL FIELD

The present disclosure relates generally to Hall effect sensor devices, and methods of forming the Hall effect sensor devices.

BACKGROUND

Hall effect sensor devices capable of determining magnetic field strengths are used in various applications, such as automotive applications. A Hall effect sensor device generally includes a Hall plate of electrically conducting material and terminals connected to the Hall plate. External voltages may be applied to the terminals to cause electric currents to flow through the Hall plate. In the presence of a magnetic field perpendicular to the plane of the Hall plate, Lorentz forces may be exerted on the charge carriers in the electric currents. This may produce a Hall voltage within the Hall plate. By determining the magnitude of the Hall voltage, the strength of the magnetic field may be determined.

Hall effect sensor devices can be implemented as semiconductor devices, with the Hall plates and terminals including doped semiconductor material. In several existing Hall effect sensor devices, an intermediate region may be arranged between each neighboring pair of terminals. This intermediate region may also include doped semiconductor material, but of a conductivity type opposite to that of the Hall plate and the terminals. This gives rise to the presence of many p-n junctions within the Hall plate. The depletion widths of these p-n junctions may vary based on the external voltages applied to the terminals and the temperature around the Hall plate. For example, these depletion widths may increase when higher external voltages are applied to the terminals. Further, the variations in the depletion widths may differ across different p-n junctions. As a result, there may be resistance mismatch between different regions of the Hall plate. Therefore, the signal-to-noise ratios (SNRs) and the offset/residual voltages (in other words, the Hall voltages produced in the absence of magnetic fields) of existing Hall effect sensor devices are generally high.

SUMMARY

According to various non-limiting embodiments, there may be provided a Hall effect sensor device including a sensor structure, wherein the sensor structure may include: a base layer having a first conductivity type; a Hall plate region having a second conductivity type opposite from the first conductivity type arranged above the base layer; a first isolating region arranged around and adjoining the Hall plate region, wherein the first isolating region may include an electrically insulating material and may contact the base layer; a plurality of second isolating regions arranged within the Hall plate region, wherein each of the plurality of second isolating regions may include an electrically insulating material; and a plurality of terminal regions arranged within the Hall plate region, each neighboring pair of terminal regions electrically isolated from each other by one of the plurality of second isolating regions.

According to various non-limiting embodiments, there may be provided a method of forming a Hall effect sensor device including: providing a substrate having a first conductivity type; forming a base layer having the first conductivity type and a first isolating region including an electrically insulating material within the substrate, wherein the first isolating region may contact the base layer; forming a Hall plate region having a second conductivity type opposite from the first conductivity type above the base layer, wherein the first isolating region may be arranged around and adjoining the Hall plate region; forming a plurality of second isolating regions within the Hall plate region, wherein each of the plurality of second isolating regions may include an electrically insulating material; and forming a plurality of terminal regions within the Hall plate region, each neighboring pair of terminal regions electrically isolated from each other by one of the plurality of second isolating regions.

According to various non-limiting embodiments, there may be provided a Hall effect sensor device including a sensor structure, wherein the sensor structure may include: an insulating layer; a Hall plate region arranged above the insulating layer; a first isolating region arranged around and adjoining the Hall plate region, wherein the first isolating region may include an electrically insulating material and may contact the insulating layer; a plurality of second isolating regions arranged within the Hall plate region, wherein each of the plurality of second isolating regions may include an electrically insulating material; and a plurality of terminal regions arranged within the Hall plate region, each neighboring pair of terminal regions electrically isolated from each other by one of the plurality of second isolating regions.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which.

DETAILED DESCRIPTION

Figure 1A:
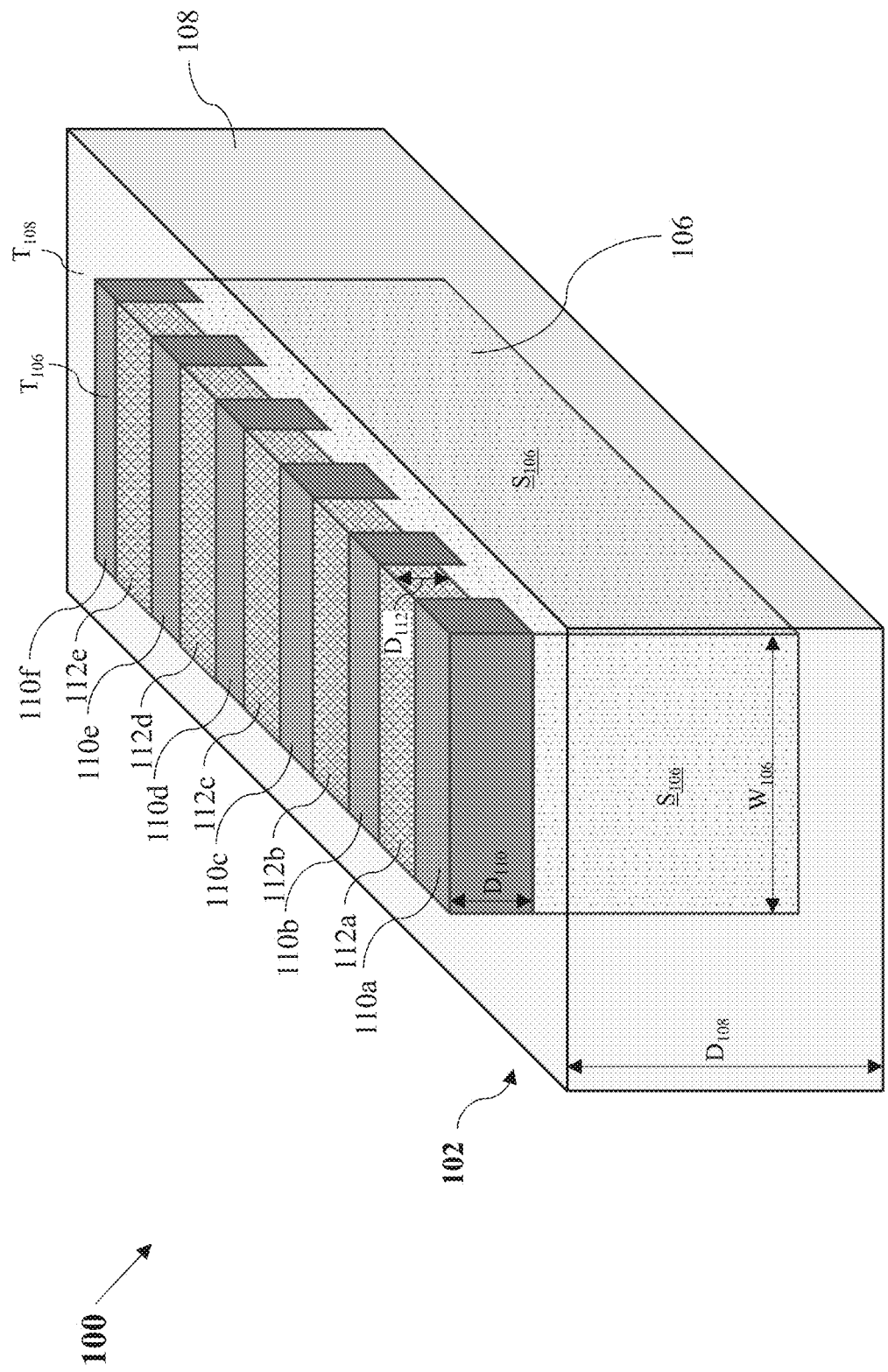
FIGS. 1A, 1B and 1C respectively show a simplified perspective view, a simplified top view and a simplified cross-sectional view of a Hall effect sensor device according to various non-limiting embodiments.

The embodiments generally relate to semiconductor devices. More particularly, some embodiments relate to sensor devices including Hall effect sensor devices. The sensor devices may be used for sensing magnetic fields and may be used in various industries, such as, but not limited to, the automotive industry for position measurements.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include"(and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 1B:
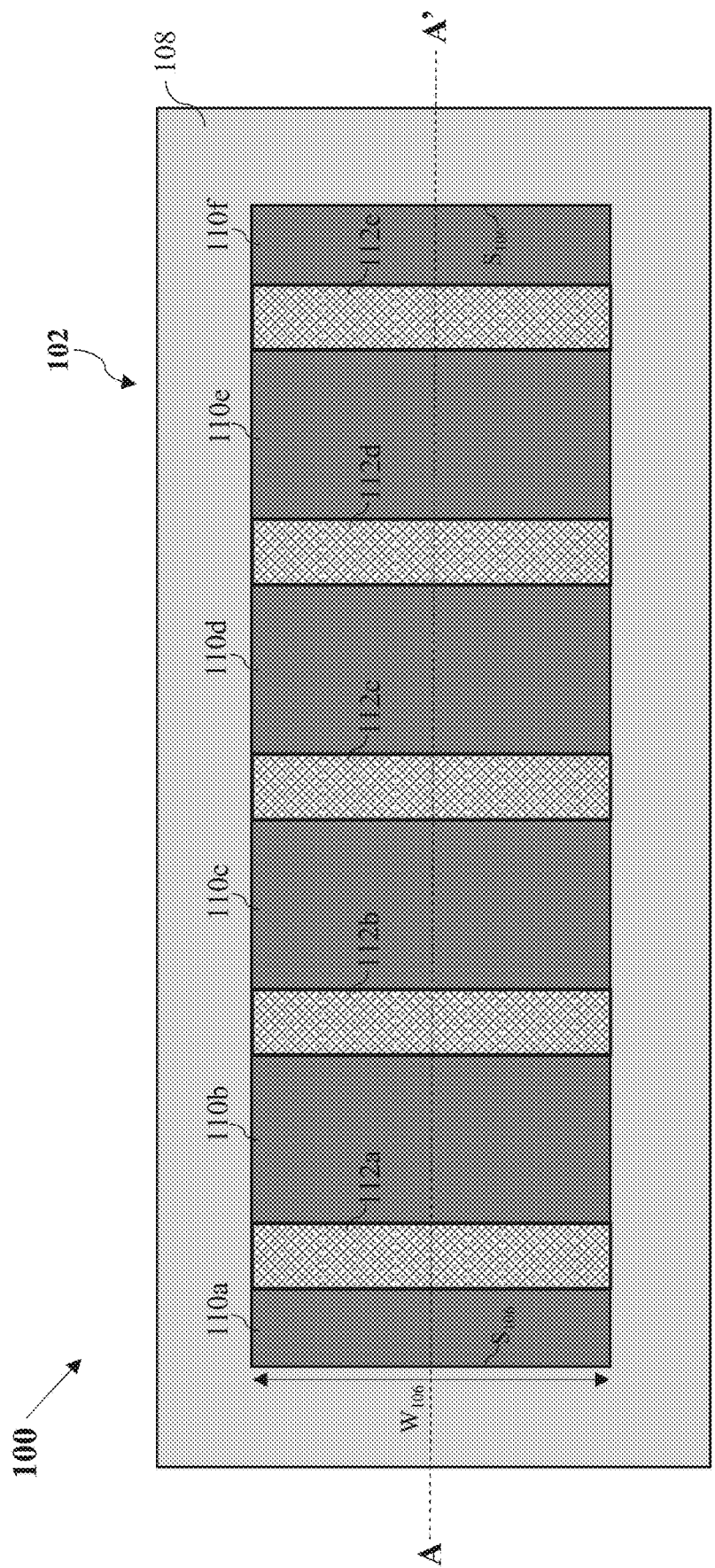
Figure 1C:
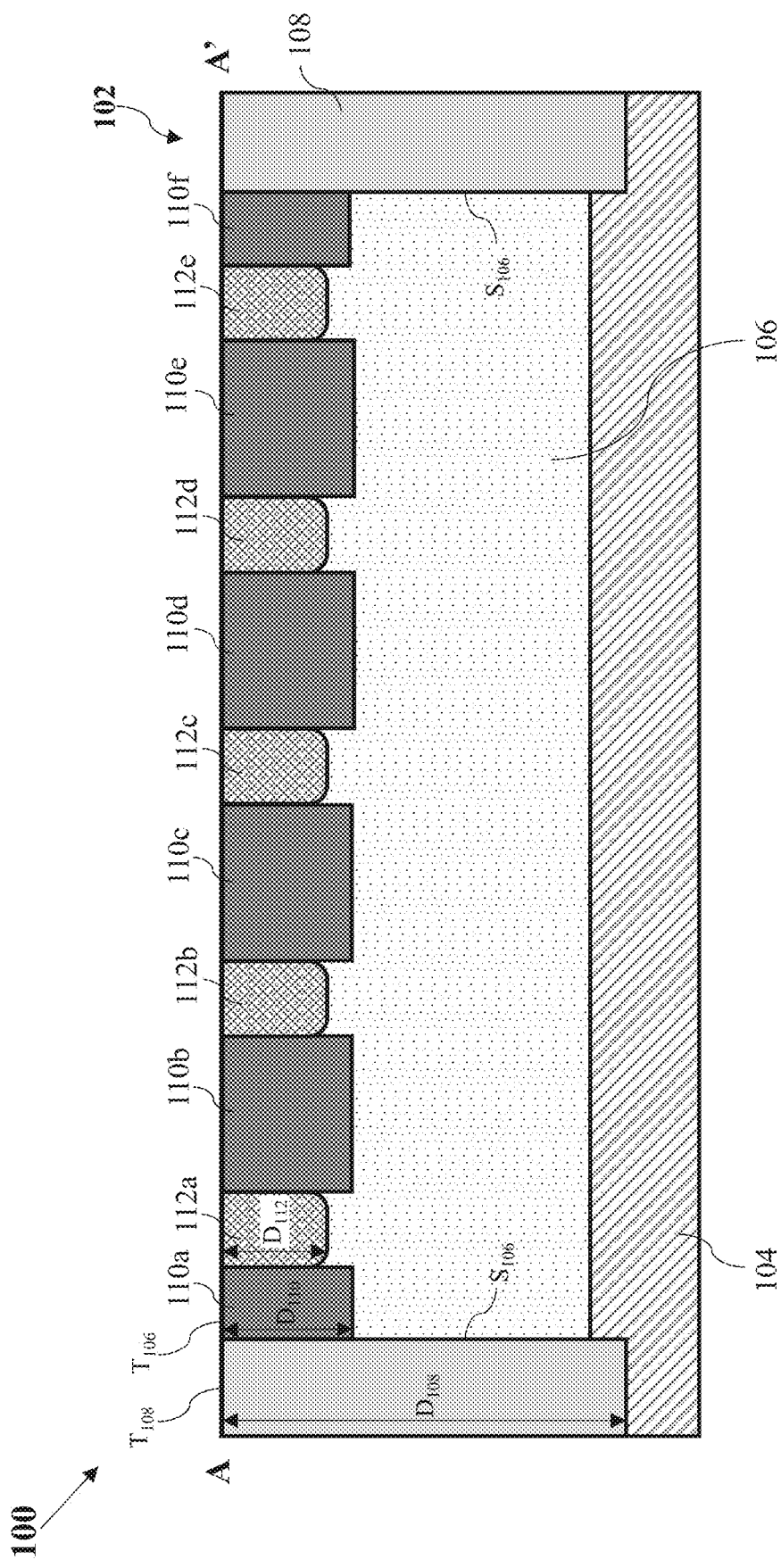

FIG. 1A shows a simplified perspective view of a Hall effect sensor device 100 according to various non-limiting embodiments. FIG. 1B shows a simplified top view of the device 100 and FIG. 1C shows a cross-sectional view of the device 100 along the line A-A' of FIG. 1B. The device 100 may be a vertical Hall effect sensor device 100 and may include a single sensor structure 102.

As shown in FIG. 1C, the sensor structure 102 may include a base layer 104. The base layer 104 may include a semiconductor substrate, such as a silicon substrate. Other types of semiconductor substrates, such as a silicon germanium substrate, may also be used. The base layer 104 may have a first conductivity type, where the first conductivity type may be p-type or n-type. For example, the base layer 104 may include a p-type substrate or an n-type substrate. Note that for simplicity, the base layer 104 is not shown in FIG. 1A.

The sensor structure 102 may further include a substantially rectangular Hall plate region 106 arranged above the base layer 104. The Hall plate region 106 may alternatively be referred to as the sensor body. The Hall plate region 106 may have a single conductivity type. For example, the Hall plate region 106 may have a second conductivity type opposite from the first conductivity type. The second conductivity type may be p-type or n-type. By configuring the base layer 104 and the Hall plate region 106 such that they may include dopants of opposite conductivity types, current flow from the Hall plate region 106 through the base layer 104 may be minimized (and in one non-limiting example, may be fully restricted).

The sensor structure 102 may further include a first isolating region 108 arranged above the base layer 104 around the Hall plate region 106. The first isolating region 108 may adjoin the Hall plate region 106 and may contact the base layer 104. As shown in FIG. 1C, the first isolating region 108 may extend partially into the base layer 104 (although, alternatively, the entire first isolating region 108 may be above the base layer 104). Further, a top surface $T_{108}$ of the first isolating region 108 may be horizontally aligned with a top surface $T_{106}$ of the Hall plate region 106. Accordingly, the first isolating region 108 may completely surround sides $S_{106}$ of the Hall plate region 106. The first isolating region 108 may include a deep trench isolation (DTI) structure, and may include an electrically insulating material, such as, but not limited to polysilicon. A thickness $D_{108}$ of the first isolating region 108 may range from about 1 um to about 3 um, and may be about 2 um in a non-limiting embodiment.

As shown in FIGS. 1A to 1C, the sensor structure 102 may further include a plurality of second isolating regions 110a-110f arranged within the Hall plate region 106, and along the top surface $T_{106}$ of the Hall plate region 106. As more clearly shown in FIG. 1B, the second isolating regions 110a-110f may extend substantially parallel to one another. In particular, the second isolating regions 110a-110f may extend across a width $W_{106}$ of the Hall plate region 106, such that at least one second isolating region 110a-110f may contact the first isolating region 108 at one or both ends of the width $W_{106}$. For example, as shown in FIG. 1B, each second isolating region 110a-110f may contact the first isolating region 108 at both ends of the width $W_{106}$. Alternatively, one or more second isolating regions 110a-110f may not contact the first isolating region 108, or may contact the first isolating region 108 at only one end of the width $W_{106}$. Each second isolating region 110a-110f may include a shallow trench isolation (STI) structure, and may include an electrically insulating material, such as, but not limited to a dielectric material. For example, the second isolating regions 110a-110f may include gap fill oxide or nitride, or a combination of both. A thickness $D_{110}$ of each second isolating region 110a-110f may be smaller than the thickness $D_{108}$ of the first isolating region 108. Accordingly, while the first isolating region 108 may contact the base layer 104, the second isolating regions 110a-110f may not. The thickness $D_{110}$ of each second isolating region 110a-110f may be equal to or greater than 0.4 um. As shown in FIG. 1C, the second isolating regions 110a-110f in the device 100 may have a same thickness $D_{110}$ but in alternative embodiments, the second isolating regions 110a-110f may have different thicknesses.

The sensor structure 102 may further include a plurality of terminal regions including first to fifth terminal regions 112a-112e arranged within the Hall plate region 106. The plurality of terminal regions 112a-112e may also be arranged along the top surface $T_{106}$ of the Hall plate region 106. In particular, each terminal region 112a-112e may be arranged between two second isolating regions 110a-110f, and therefore, each neighboring pair of terminal regions 112a-112e may be electrically isolated from each other by one of the second isolating regions 110a-110f. As shown in FIG. 1C, the plurality of terminal regions 112a-112e may adjoiningly alternate with the plurality of second isolating regions 110a-110f. In other words, each terminal region 112a-112e may adjoin the second isolating regions 110a-110f it is arranged between. As more clearly shown in FIG. 1B, the terminal regions 112a-112e may extend substantially parallel to one another and to the second isolating regions 110a-110f. Similar to the second isolating regions 110a-110f, the terminal regions 112a-112e may also extend across the width $W_{106}$ of the Hall plate region 106, such that at least one terminal region 112a-112e may contact the first isolating region 108 at one or both ends of the width $W_{106}$. For example, as shown in FIG. 1B, each terminal region 112a-112e may contact the first isolating region 108 at both ends of the width $W_{106}$. Alternatively, one or more terminal regions 112a-112e may not contact the first isolating region 108 or may contact the first isolating region 108 at only one end of the width $W_{106}$.

The plurality of second isolating regions 110a-110f may extend deeper into the Hall plate region 106 than the plurality of terminal regions 112a-112e. In other words, a thickness $D_{112}$ of each terminal region 112a-112e may be smaller than the thickness $D_{110}$ of each second isolating region 110a-110f. The thickness $D_{112}$ of each terminal region 112a-112e may range from about 0.1 um to about 1.5 um. As shown in FIG. 1C, the terminal regions 112a-112e in the device 100 may have a same thickness $D_{112}$, but in alternative embodiments, the terminal regions 112a-112e may have different thicknesses.

As shown in FIGS. 1A to 1C, the first and fifth terminal regions 112a, 112e may be spaced apart from the first isolating region 108 by respective second isolating regions 110a, 110f, where these second isolating regions 110a, 110f may adjoin the first isolating region 108 along the width $W_{106}$ of the Hall plate region 106. Alternatively, the second isolating regions 110a, 110f in the device 100 may be omitted, and the first and fifth terminal regions 112a, 112e may adjoin the first isolating region 108 along the width $W_{106}$ of the Hall plate region 106. Further, while five terminal regions 112a-112e and six second isolating regions 110a-110f are depicted in FIGS. 1A to 1C, more or less of each region may be included.

In the device 100, each of the terminal regions 112a-112e may have a single conductivity type. In particular, the terminal regions 112a-112e and the Hall plate region 106 may have a same conductivity type (the second conductivity type). In other words, when the base layer 104 includes p-type dopants, the Hall plate region 106 and the terminal regions 112a-112e may include n-type dopants; and when the base layer 104 includes n-type dopants, the Hall plate region 106 and the terminal regions 112a-112e may include p-type dopants. The p-type dopants may include boron (B), aluminum (Al), indium (In), or combinations thereof; whereas, the n-type dopants may include phosphorous (P), arsenic (As), antimony (Sb), or combinations thereof. The Hall plate region 106 may be more heavily doped (in other words, may include a higher dopant concentration (number of dopants per unit volume)) than the base layer 104; whereas, the terminal regions 112a-112e may be more heavily doped than the Hall plate region 106. For example, the base layer 104 may have a dopant concentration ranging from about 1e15 $cm^{-3}$ to about 1e16 $cm^{-3}$, and each terminal region 112a-112e may have a dopant concentration ranging from about 1e19 $cm^{-3}$ to about 1e20 $cm^{-3}$.

Figure 2:
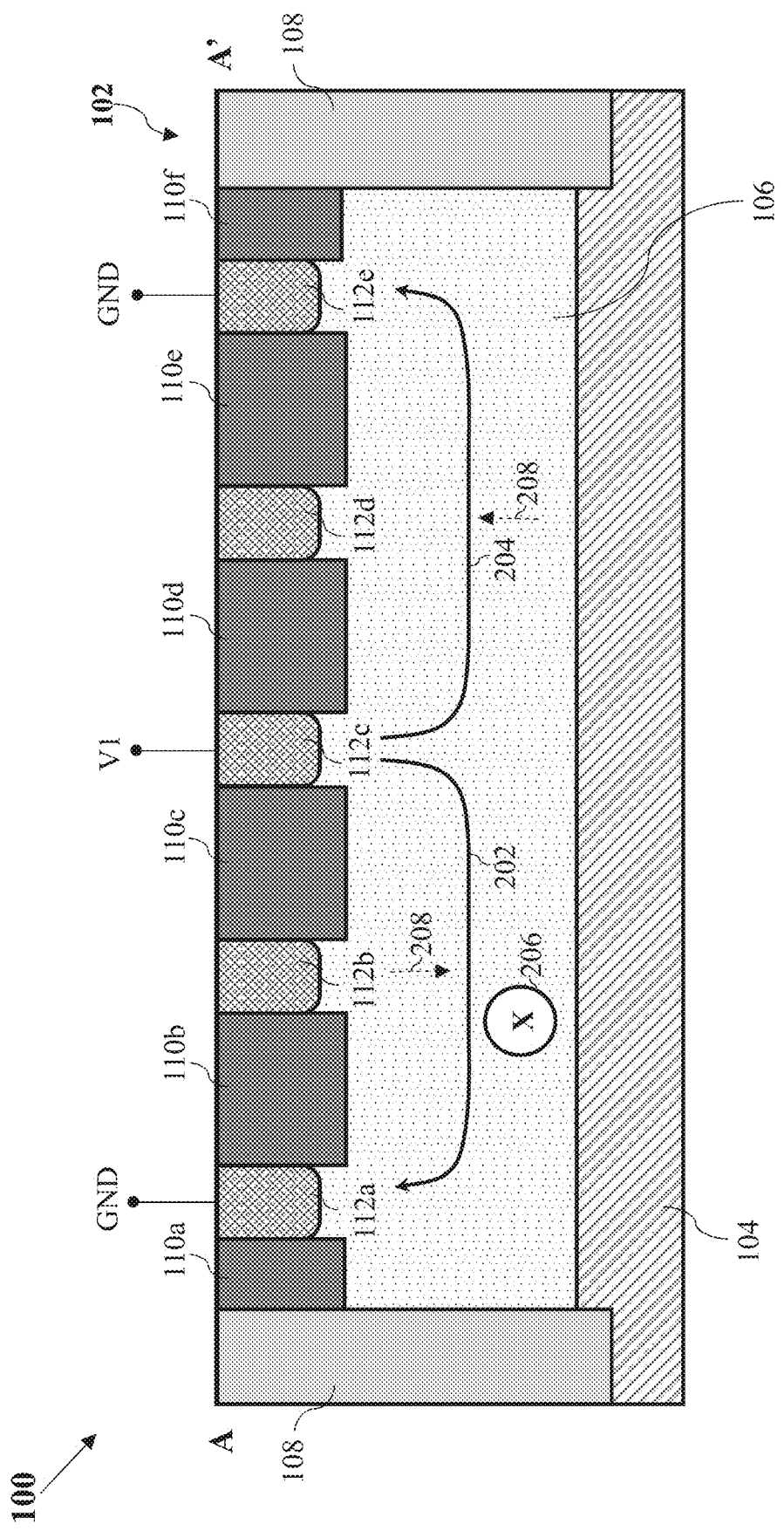
FIG. 2 shows the Hall effect sensor device of FIGS. 1A to 1C in use.

Each of the terminal regions 112a-112e may be configured to electrically connect to an external device. The external device may be configured to provide a current through the Hall plate region 106 (e.g. the external device may be an external voltage source) or may be configured to determine a Hall voltage produced in the Hall plate region 106. For example, FIG. 2 shows the device 100 with the first, third and fifth terminal regions 112a, 112c, 112e electrically connected to external voltage sources. The second and fourth terminal regions 112b, 112d may be connected to an external device (not shown in FIG. 2) to determine the Hall voltage. In other words, the first, third and fifth terminal regions 112a, 112c, 112e may serve as current terminal regions; whereas, the second and fourth terminal regions 112b, 112d may serve as sensing terminal regions. Note that the dimensions $D_{108}$, $D_{110}$, $D_{112}$, surfaces $T_{106}$, $T_{108}$ and sides $S_{106}$ are not labelled in FIG. 2 to avoid cluttering the figure.

In particular, as shown in FIG. 2, the first and fifth terminal regions 112a, 112e may be connected to a ground voltage GND (in other words, 0V); whereas, the third terminal region 112c may be connected to an external voltage V1 larger than the ground voltage GND. Depending on the technology used to fabricate the Hall effect sensor device 100, the external voltage V1 may range from about 1V to about 6V. Due to the voltage differences between the first and third terminal regions 112a, 112c and between the third and fifth terminal regions, 112c, 112e, first and second currents 202, 204 including charge carriers may flow through the Hall plate region 106 in opposite directions. In particular, the first current 202 may flow from the third terminal region 112c to the first terminal region 112a; whereas, the second current 204 may flow from the third terminal region 112c to the fifth terminal region 112e. In the presence of a magnetic field 206 perpendicular to the plane of the Hall plate region 106 (in other words, into the paper and perpendicular to the flow of the currents 202, 204 as shown in FIG. 2), Lorentz forces may be exerted on the charge carriers of the first and second currents 202, 204 in opposite vertical directions 208. A voltage difference (or in other words, a Hall voltage) may thus be produced between the second and fourth terminal regions 112b, 112d, and may be determined by the external device to which these terminal regions 112b, 112d are connected. The Hall voltage may be proportional to the strength of the magnetic field 206, and thus, by determining the Hall voltage, the strength of the magnetic field 206 may be determined.

The terminal regions 112a-112e may be connected to external devices in a manner different from that described with reference to FIG. 2. For example, the fourth terminal region 112d and the second terminal region 112b may be connected to a ground voltage GND and an external voltage (similar to the above-mentioned V1), respectively; whereas, the first, third and fifth terminal regions 112a, 112c, 112e may be connected to an external device to measure the Hall voltage produced in the Hall plate region 106. The first and fifth terminal regions 112a, 112e may be tied to a same connector of the external device.

The first and second isolating regions 108, 110a-110f in the device 100 may help to restrict the amount of change in the sizes and shapes of the Hall plate region 106 and the terminal regions 110a-110e. Further, since there may be fewer p-n junctions in the Hall plate region 106 of the device 100 as compared to prior art Hall effect sensor devices, the performance of the device 100 may be less sensitive to temperature changes around the Hall plate region 106, dopant variations in different terminal regions 112a-112e and external voltages applied to the Hall plate region 106. In turn, the resistance mismatch between different regions within the Hall plate region 106 may be lower and the offset voltage of the device 100 may be reduced. In addition, by surrounding the Hall plate region 106 with the first isolating region 108 and the base layer 104, flow of the currents 202-204 may be better confined within the Hall plate region 106.

To further reduce the offset voltage, a spinning current technique may be applied when using the device 100. In this technique, the device 100 may be operated in four modes. In the first and second modes, the first, third and fifth terminal regions 112a, 112c, 112e may serve as current terminal regions; whereas, the second and fourth terminal regions 112b, 112d may serve as sensing terminal regions. In particular, in the first mode, the first and fifth terminal regions 112a, 112e may be connected to a ground voltage GND, and the third terminal region 112c may be connected to an external voltage V1. In the second mode, the first and fifth terminal regions 112a, 112e may be connected to an external voltage V1, and the third terminal region 112c may be connected to a ground voltage GND, so that the flow of currents through the Hall plate region 106 in the second mode may be opposite from those in the first mode. In the third and fourth modes, the first, third and fifth terminal regions 112a, 112c, 112e may serve as sensing terminal regions; whereas, the second and fourth terminal regions 112b, 112d may serve as current terminal regions. In particular, in the third mode, the second terminal region 112b may be connected to a ground voltage GND and the fourth terminal region 112d may be connected to an external voltage V1; whereas, in the fourth mode, the second terminal region 112b may be connected to an external voltage V1 and the fourth terminal region 112d may be connected to a ground voltage GND. The Hall voltage may be determined in each mode and the final Hall voltage of the device 100 may be obtained using an average of the Hall voltages determined in the four modes. Averaging the Hall voltages in the four modes may help to filter away at least a part of the offset voltage of the device 100 from the final Hall voltage. Accordingly, the resulting offset voltage of the device 100 may be reduced.

Figure 3:
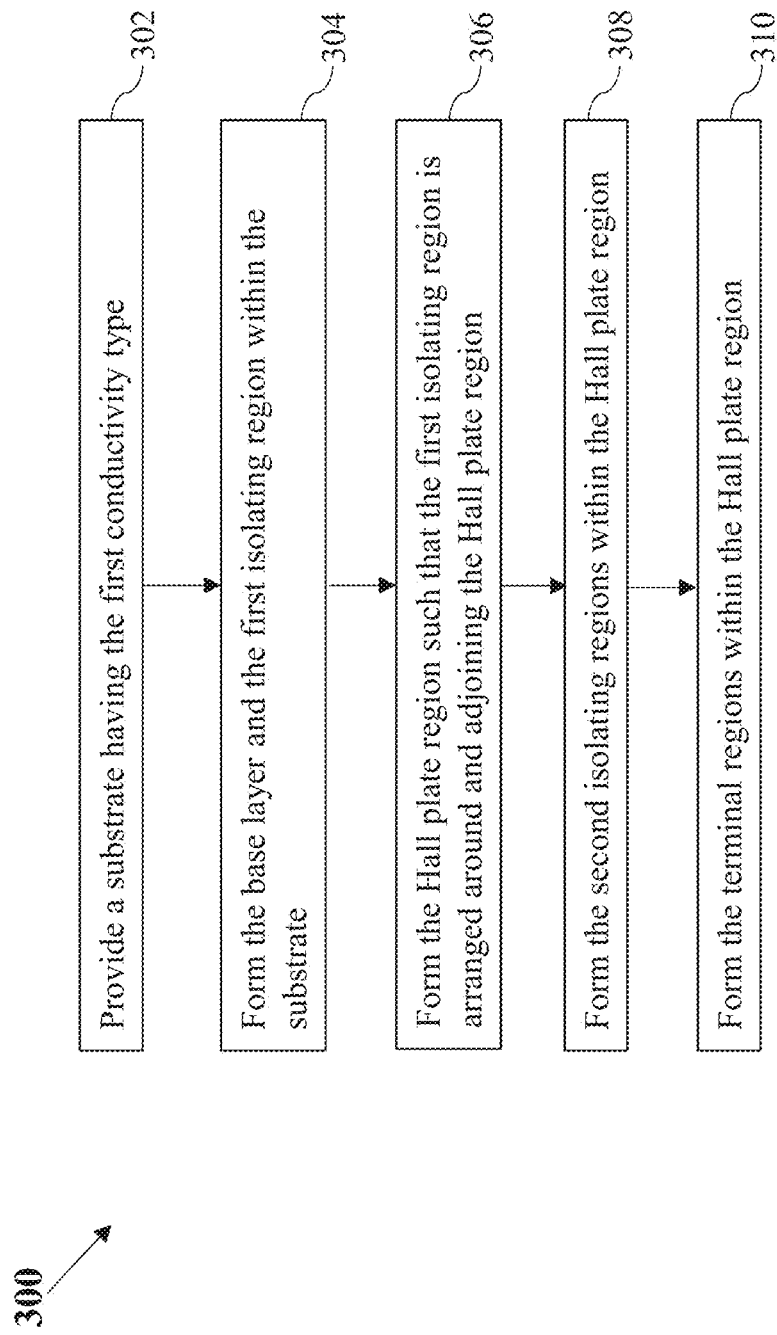
FIG. 3 shows a flow chart illustrating a method of forming the Hall effect sensor device of FIGS. 1A to 1C.

The Hall effect sensor device 100 may be formed with existing technology without using additional mask layers. FIG. 3 shows a flow chart illustrating a method 300 for forming the device 100 according to various non-limiting embodiments.

Referring to FIG. 3, at 302, a substrate having the first conductivity type may be provided and at 304, the base layer 104 and the first isolating region 108 may be formed within the substrate. The base layer 104 and the first isolating region 108 may be formed by any method as known to those skilled in the art. For example, the substrate may be etched to form a vertical opening extending partially through the substrate. The vertical opening may then be filled with electrically insulating material to form the first isolating region 108 and the substrate under the vertical opening may serve as the base layer 104.

At 306, the Hall plate region 106 may be formed above the base layer 104, such that the first isolating region 108 is arranged around and adjoining the Hall plate region 106. The Hall plate region 106 may be formed by doping a region of the substrate surrounded by the first isolating region 108 with dopants of the appropriate conductivity type.

At 308, the second isolating regions 110a-110f may be formed within the Hall plate region 106. This may be done by etching the Hall plate region 106 to form a plurality of openings, and depositing electrically insulating material into these openings.

At 310, the terminal regions 112a-112e may be formed within the Hall plate region 106. This may be done by doping areas between the second isolating regions 110a-110f with dopants of the appropriate conductivity type.

The above described order for the method is only intended to be illustrative, and the method is not limited to the above specifically described order unless otherwise specifically stated. In addition, the Hall effect sensor device 100 may be implemented as part of an integrated circuit, and the method may further include other processes as known to those skilled in the art, for example, processes for forming transistors, and/or back-end-of-line (BEOL) processes for forming inter-layer-dielectric (ILD) layers and contacts.

Figure 4:
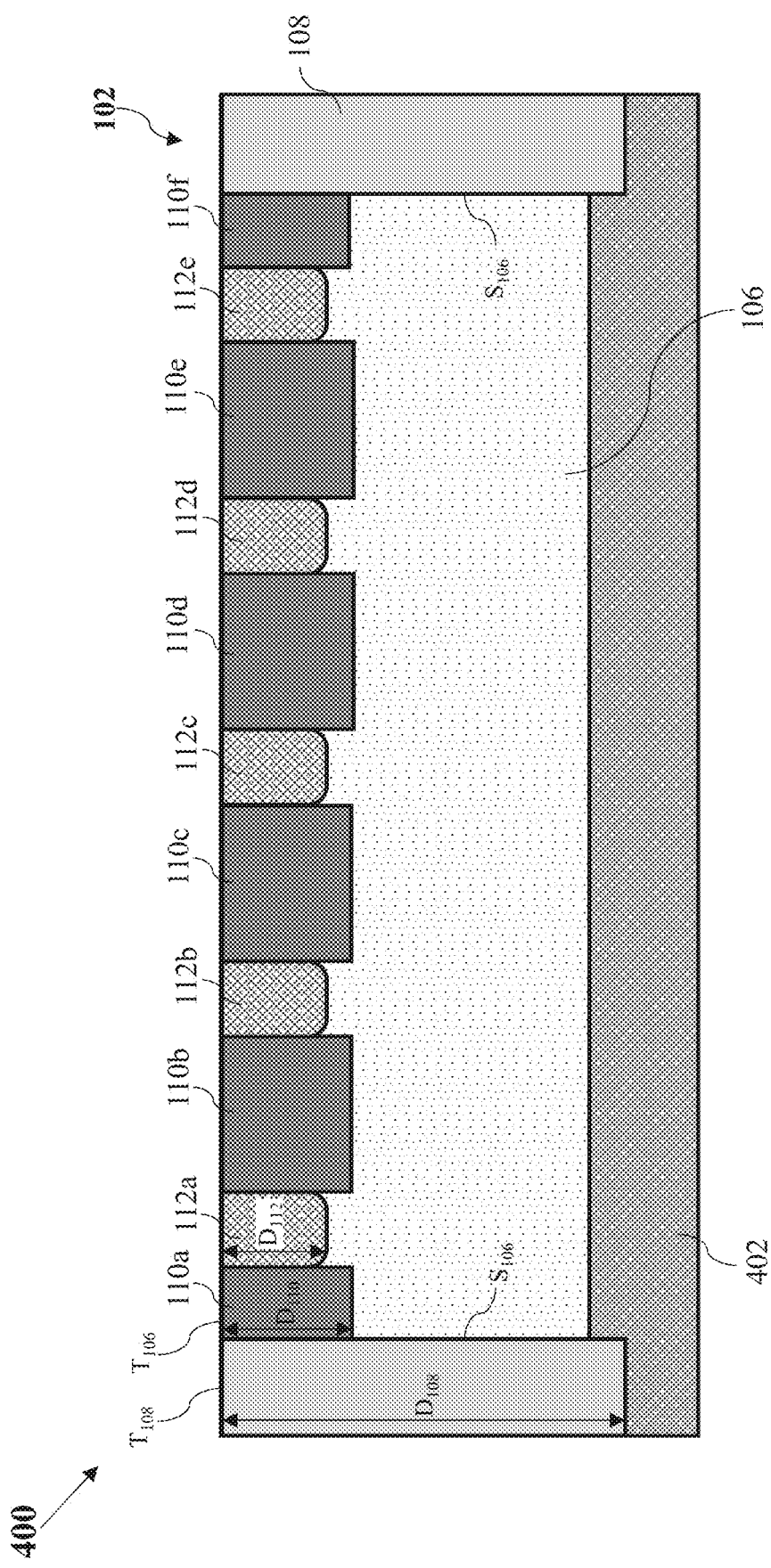
FIG. 4 shows a simplified cross-sectional view of a Hall effect sensor device according to alternative non-limiting embodiments.

FIG. 4 shows a Hall effect sensor device 400 according to alternative non-limiting embodiments. The semiconductor device 400 is similar to the semiconductor device 100, and thus, the common features are labelled with the same reference numerals and need not be discussed.

Referring to FIG. 4, as compared to the device 100, the base layer 402 of the device 400 may instead include an insulating layer. This insulating layer may include insulating material that may minimize (or in a non-limiting example, fully restrict) current flow from the Hall plate region 106 through the base layer 402. For example, the base layer 402 may include a buried oxide layer and the insulating material may include silicon dioxide. The insulating layer may also help to further isolate the Hall plate region 106 from neighboring components/structures, particularly, those under the Hall plate region 106. Although not shown in FIG. 4, the device 400 may further include a semiconductor substrate similar to the base layer 104 of the device 100 and the base layer 402 may be arranged within this semiconductor substrate. However, this semiconductor substrate may be omitted. Alternatively, further layers may be arranged between the base layer 402 and the semiconductor substrate. In use, the device 400 may operate in a manner similar to that described above for the device 100.

Figure 5A:
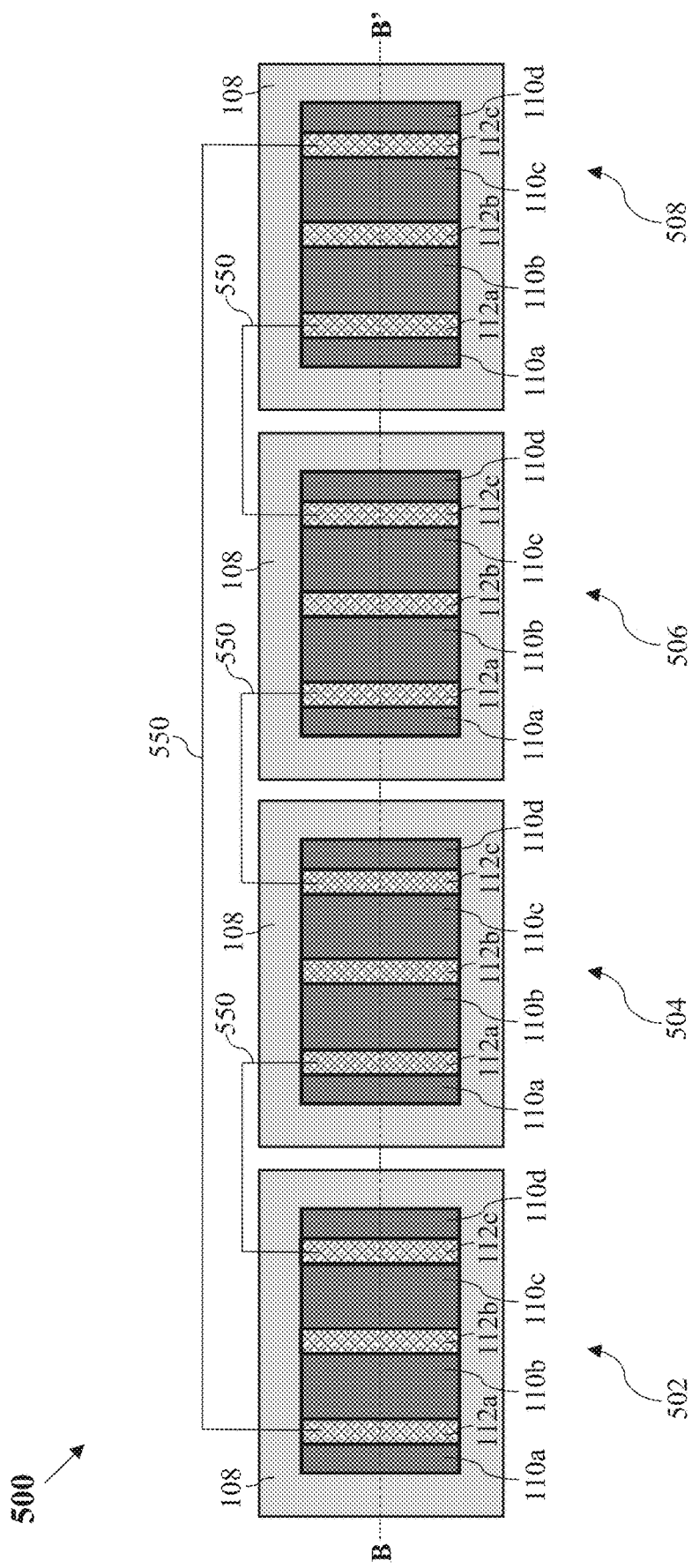
FIGS. 5A and 5B respectively show a simplified top view and a simplified cross-sectional view of a Hall effect sensor device according to alternative non-limiting embodiments.
Figure 5B:
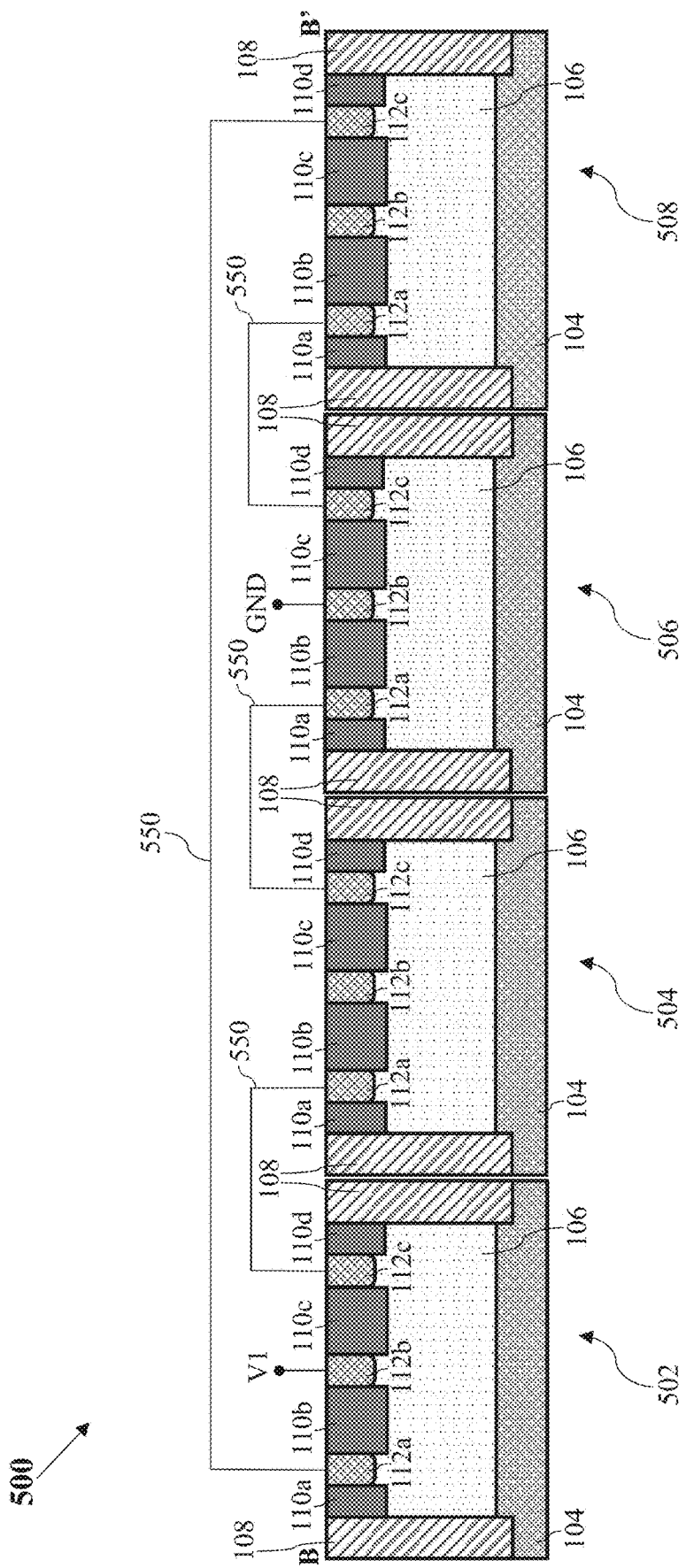

FIG. 5A shows a simplified top view of a Hall effect sensor device 500 according to alternative non-limiting embodiments, and FIG. 5B shows a simplified cross-sectional view of the device 500 along the line B-B' of FIG. 5A. The device 500 may include further sensor structures. In particular, the device 500 may include a plurality of sensor structures including a first sensor structure 502, a second sensor structure 504, a third sensor structure 506 and a fourth sensor structure 508. Each of these sensor structures 502, 504, 506, 508 is similar to the sensor structure 102 of the semiconductor device 100, and thus, the common features are labelled with the same reference numerals and need not be discussed. Note however that to avoid cluttering the figures, the dimensions $W_{106}$, $D_{108}$, $D_{110}$, $D_{112}$, surfaces $T_{106}$, $T_{108}$ and sides $S_{106}$ are not labelled in FIGS. 5A and 5B. Further, although four sensor structures are shown, the number of sensor structures in the Hall effect sensor device 500 may be greater than or less than four.

Referring to FIGS. 5A and 5B, as compared to the sensor structure 102 of the semiconductor device 100, each sensor structure 502-508 of the device 500 may include fewer terminal regions 112a-112c and second isolating regions 110a-110d. In particular, each sensor structure 502-508 may include only a first terminal region 112a, a second terminal region 112b and a third terminal region 112c. The sensor structures 502-508 in the semiconductor device 500 may be electrically connected to one another using connectors 550. The connectors 550 may include an electrically conductive material, such as, but not limited to aluminum, copper, tungsten, alloys thereof or combinations thereof. For example, the connectors 550 may include electrical wires. As shown in FIG. 5A, the first, second, third and fourth sensor structures 502, 504, 506, 508 may be arranged along a same axis (along the line B-B') of FIG. 5A and may be connected in said order in series. In particular, the first terminal region 112a of the first sensor structure 502 may be electrically connected with the third terminal region 112c of the fourth sensor structure 508. Further, the third terminal regions 112c of the first, second and third sensor structures 502, 504, 506 may be electrically connected with the first terminal regions 112a of the second, third and fourth sensor structures 504, 506, 508 respectively.

Figure 6:
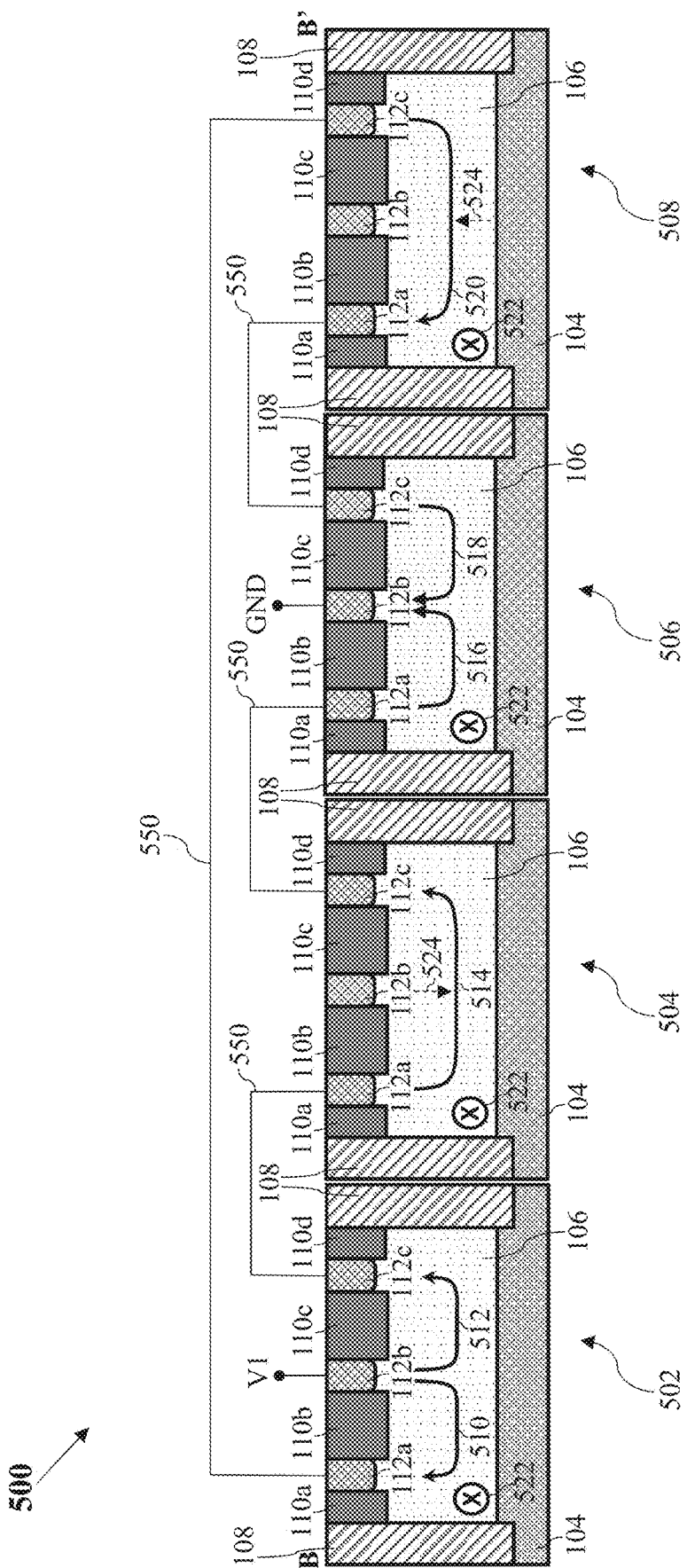
FIG. 6 shows the Hall effect sensor device of FIGS. 5A and 5B in use.

FIG. 6 shows the Hall effect sensor device 500 in use with the second terminal region 112b of the first sensor structure 502 connected to an external voltage V1 (similar to the V1 in FIG. 2), and the second terminal region 112b of the third sensor structure 506 connected to a ground voltage GND. The second terminal regions 112b of the second and fourth sensor structures 504, 508 may be connected to an external device (not shown in FIG. 6) to determine a Hall voltage through the device 500. In other words, the second terminal regions 112b of the first and third sensor structures 502, 506 may serve as current terminal regions, and the second terminal regions 112b of the second and fourth sensor structures 504, 508 may serve as sensing terminal regions.

As shown in FIG. 6, due to the voltage difference between the second terminal regions 112b of the first and third sensor structures 502, 506, first to sixth currents 510-520 including charge carriers may flow through the Hall plate regions 106 of the sensor structures 502-508. In particular, the first and second currents 510, 512 may flow in opposite directions through the Hall plate region 106 of the first sensor structure 502, with the first current 510 flowing from the second terminal region 112b to the first terminal region 112a, and the second current 512 flowing from the second terminal region 112b to the third terminal region 112c. The third current 514 may flow through the Hall plate region 106 of the second sensor structure 504 from the first terminal region 112a to the third terminal region 112c. Similar to the first and second currents 510, 512, the fourth and fifth currents 516, 518 may flow in opposite directions through the Hall plate region 106 of the third sensor structure 506. However, the fourth current 516 may flow from the first terminal region 112a to the second terminal region 112b; whereas, the fifth current 518 may flow from the third terminal region 112c to the second terminal region 112b. Further, the sixth current 520 may flow from the third terminal region 112c to the first terminal region 112a through the Hall plate region 106 of the fourth sensor structure 508.

In the presence of a magnetic field 522 perpendicular to the planes of the Hall plate regions 106 (into the paper and perpendicular to the flow of the first to sixth currents 510-520 as shown in FIG. 6), Lorentz forces may be exerted on the charge carriers of the third and sixth currents 514, 520 in opposite vertical directions 524. A voltage difference (or in other words, a Hall voltage) may thus be produced between the second terminal regions 112b of the second and fourth sensor structures 504, 508, and may be determined by the external device to which these terminal regions 112b are connected. The Hall voltage may be proportional to the strength of the magnetic field 522, and thus, the device 500 may determine the strength of the magnetic field 522 based on the Hall voltage.

Figure 7:
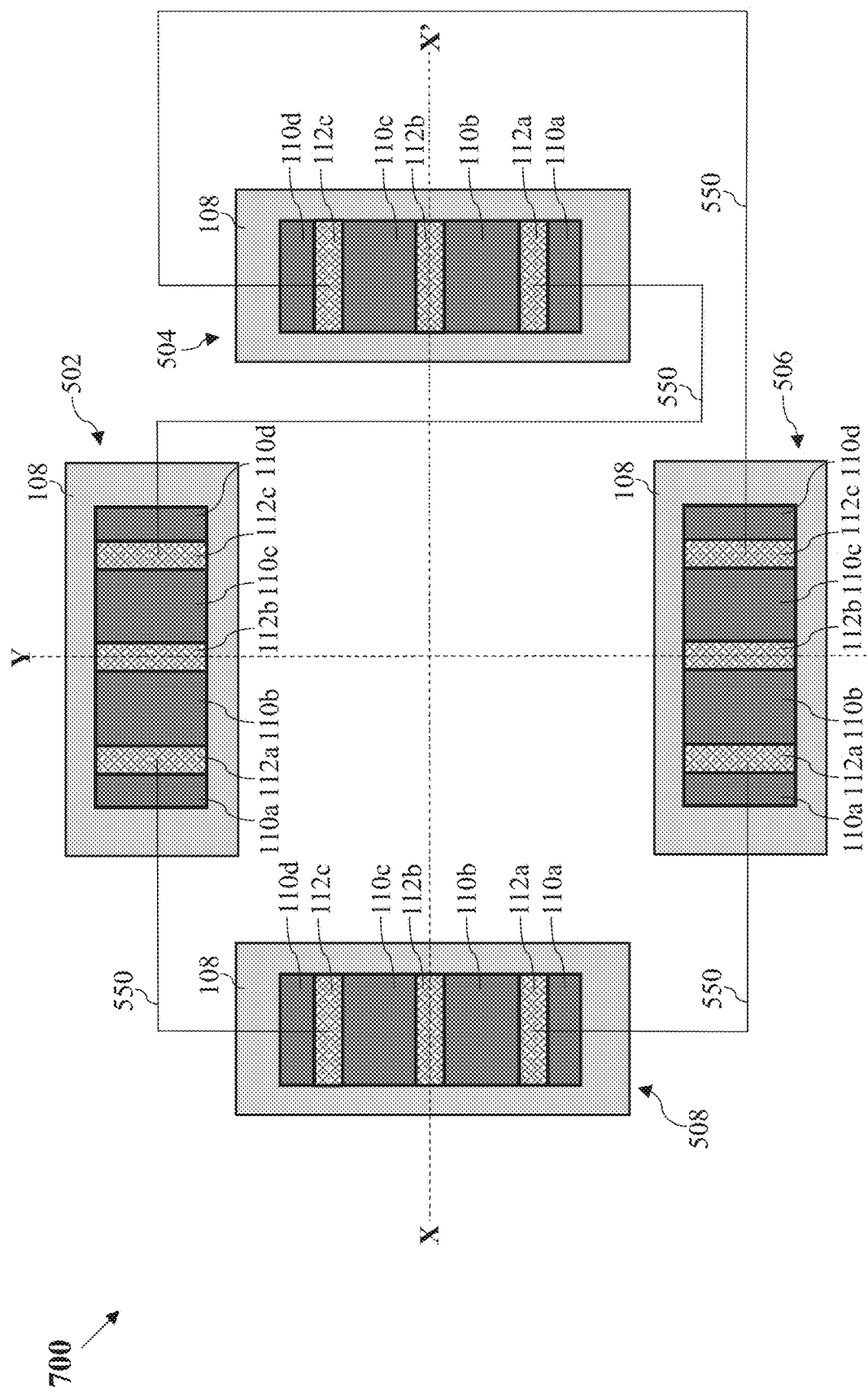
FIG. 7 shows a simplified top view of a Hall effect sensor device according to alternative non-limiting embodiments.

FIG. 7 shows a simplified top view of a Hall effect sensor device 700 according to alternative non-limiting embodiments. The device 700 is similar to the device 600, and thus, the common features are labelled with the same reference numerals and need not be discussed.

Referring to FIG. 7, the device 700 may also include a plurality of sensor structures including first, second, third and fourth sensor structures 502, 504, 506, 508 similar to those of the device 600. However, as compared to the device 600, the sensor structures 502-508 of the device 700 may not be arranged along a same axis but may instead be arranged in a cross configuration. In particular, as shown in FIG. 7, the first and third sensor structures 502, 506 may be arranged along a first axis Y-Y'; whereas, the second and fourth sensor structures 504, 508 may be arranged along a second axis X-X' perpendicular to the first axis Y-Y'. The sensor structures 502-508 may similarly be electrically connected to one another using connectors 550. In particular, the first, second, third and fourth sensor structures 502-508 may be connected in said order in series. As shown in FIG. 7, the third terminal region 112c of the first sensor structure 502 may be connected to the first terminal region 112a of the second sensor structure 504, the third terminal region 112c of the second sensor structure 504 may be connected to the third terminal region 112c of the third sensor structure 506, the first terminal region 112a of the third sensor structure 506 may be connected to the first terminal region 112a of the fourth sensor structure 508, and the third terminal region 112c of the fourth sensor structure 508 may be connected to the first terminal region 112a of the first sensor structure 502. This connection of the sensor structures 502-508 in the device 700 may allow the device 700 to detect strengths of magnetic fields parallel to the X-X' axis. Alternatively, the sensor structures 502-508 may be connected in a different manner to detect strengths of magnetic fields parallel to other axes (e.g. the Y-Y' axis), or may be connected to switching elements configured to change the connections of the sensor structures 502-508 according to the directions of the magnetic fields whose strengths are to be determined.

The flow of the currents through the devices 500 and 700 may be more symmetrical, as compared to that through the device 100. This may be because as shown in FIG. 6, when the device 500 is in use, the flow of the current(s) 510-520 in each sensor structure 502-508 may be similar to that in another sensor structure 502-508, except that the direction(s) of the current(s) 510-520 may be opposite. For example, in both the first and third sensor structures 502, 506, the currents 510, 512, 516, 518 flow between the second terminal region 112b and the first/third terminal region 112a, 112c, but the currents 510, 512 in the first sensor structure 502 may be in opposite directions from those in the third sensor structure 506. Similarly, in both the second and fourth sensor structures 504, 508, the currents 514, 520 flow between the first and third terminal regions 112a, 112c, but in opposite directions.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A Hall effect sensor device comprising a sensor structure, wherein the sensor structure comprises:
   a base layer having a first conductivity type;
   a Hall plate region having a second conductivity type opposite from the first conductivity type arranged above the base layer;
   a first isolating region arranged around and adjoining the Hall plate region, wherein the first isolating region comprises an electrically insulating material and contacts the base layer;
   a plurality of second isolating regions arranged within the Hall plate region, wherein each of the plurality of second isolating regions comprises an electrically insulating material; and
   a plurality of terminal regions arranged within the Hall plate region, each neighboring pair of terminal regions electrically isolated from each other by one of the plurality of second isolating regions,
   wherein the plurality of terminal regions adjoiningly alternate with the plurality of second isolating regions.

2. The Hall effect sensor device of claim 1, wherein the plurality of second isolating regions extend deeper into the Hall plate region than the plurality of terminal regions.

3. The Hall effect sensor device of claim 1, wherein the first isolating region completely surrounds sides of the Hall plate region.

4. The Hall effect sensor device of claim 1, wherein the first isolating region extends partially into the base layer.

5. The Hall effect sensor device of claim 1, wherein the plurality of second isolating regions extend across a width of the Hall plate region, such that at least one second isolating region of the plurality of second isolating regions contacts the first isolating region at one or both ends of the width.

6. The Hall effect sensor device of claim 1, wherein the plurality of terminal regions extends across a width of the Hall plate region, such that at least one terminal region of the plurality of terminal regions contacts the first isolating region at one or both ends of the width.

7. The Hall effect sensor device of claim 1, wherein the plurality of terminal regions extend substantially parallel to one another across a width of the Hall plate region.

8. The Hall effect sensor device of claim 1, wherein the plurality of second isolating regions and the plurality of terminal regions are arranged along a top surface of the Hall plate.

9. The Hall effect sensor device of claim 1, wherein a top surface of the first isolating region is horizontally aligned with a top surface of the Hall plate region.

10. The Hall effect sensor device of claim 1, wherein the first isolating region comprises a deep trench isolation structure and the plurality of second isolating regions comprise shallow trench isolation structures.

11. The Hall effect sensor device of claim 1, wherein the plurality of terminal regions and the Hall plate region have a same conductivity type.

12. The Hall effect sensor device of claim 1, wherein the plurality of terminal regions are more heavily doped than the Hall plate region.

13. The Hall effect sensor device of claim 1, wherein the Hall effect sensor device comprises a single sensor structure.

14. The Hall effect sensor device of claim 1, wherein the Hall effect sensor device comprises further sensor structures, wherein the sensor structure and the further sensor structures are electrically connected to one another.

15. The Hall effect sensor device of claim 14, wherein the sensor structure and the further sensor structures comprise a first sensor structure, a second sensor structure, a third sensor structure and a fourth sensor structure electrically connected in said order in series, wherein the first sensor structure and the third sensor structure are arranged along a first axis, and wherein the second sensor structure and the fourth sensor structure are arranged along a second axis perpendicular to the first axis.

16. The Hall effect sensor device of claim 1, wherein the plurality of second regions are each distinct regions and are dielectric.

17. The Hall effect sensor device of claim 1, wherein the first sensor structure, the second sensor structure, the third sensor structure and the fourth sensor structure each comprises a first, second, third and fourth second isolating regions and a first, second and third terminal regions.

18. The Hall effect sensor device of claim 17, wherein the first terminal region of the first sensor structure is connected to the third terminal region of the fourth sensor structure, the third terminal region of the first sensor structure is connected to the first terminal region of the second sensor structure, the third terminal region of the second sensor structure is connected to the third terminal region of the third sensor structure, and the first terminal region of the third sensor structure is connected to the first terminal region of the fourth sensor structure.

19. A method of forming a Hall effect sensor device, wherein the method comprises:
   providing a substrate having a first conductivity type;
   forming a base layer having the first conductivity type and a first isolating region comprising an electrically insulating material within the substrate, wherein the first isolating region contacts the base layer;
   forming a Hall plate region having a second conductivity type opposite from the first conductivity type above the base layer, wherein the first isolating region is arranged around and adjoining the Hall plate region;
   forming a plurality of second isolating regions within the Hall plate region, wherein each of the plurality of second isolating regions comprises an electrically insulating material; and
   forming a plurality of terminal regions within the Hall plate region, each neighboring pair of terminal regions electrically isolated from each other by one of the plurality of second isolating regions,
   wherein the plurality of terminal regions adjoiningly alternate with the plurality of second isolating regions.

20. A Hall effect sensor device comprising a sensor structure, wherein the sensor structure comprises:
- an insulating layer;
- a Hall plate region arranged above the insulating layer;
- a first isolating region arranged around and adjoining the Hall plate region, wherein the first isolating region comprises an electrically insulating material and contacts the insulating layer;
- a plurality of second isolating regions arranged within the Hall plate region, wherein each of the plurality of second isolating regions comprises an electrically insulating material; and
- a plurality of terminal regions arranged within the Hall plate region, each neighboring pair of terminal regions electrically isolated from each other by one of the plurality of second isolating regions,
- wherein the plurality of terminal regions adjoiningly alternate with the plurality of second isolating regions.

* * * * *